United States Patent
Peng et al.

(10) Patent No.: US 10,444,283 B1
(45) Date of Patent: *Oct. 15, 2019

(54) SHARING A JTAG INTERFACE AMONG MULTIPLE PARTITIONS

(71) Applicant: Intel Corporation, Santa Clara, CA (US)

(72) Inventors: Yi Peng, Newark, CA (US); Andrew Martyn Draper, Chesham (GB); Nathan Edward Krueger, San Jose, CA (US)

(73) Assignee: Intel Corporation, Santa Clara, CA (US)

(*) Notice: Subject to any disclaimer, the term of this patent is extended or adjusted under 35 U.S.C. 154(b) by 112 days.

This patent is subject to a terminal disclaimer.

(21) Appl. No.: 15/432,810

(22) Filed: Feb. 14, 2017

(51) Int. Cl.
| | |
|---|---|
| *G01R 31/3185* | (2006.01) |
| *G01R 31/28* | (2006.01) |
| *G01R 31/317* | (2006.01) |
| *G06F 11/273* | (2006.01) |
| *G06F 11/267* | (2006.01) |
| *G01R 31/327* | (2006.01) |

(52) U.S. Cl.
CPC . *G01R 31/318597* (2013.01); *G01R 31/2884* (2013.01); *G01R 31/31705* (2013.01); *G06F 11/267* (2013.01); *G06F 11/2733* (2013.01)

(58) Field of Classification Search
CPC ........ G01R 31/318597; G01R 31/2884; G01R 31/31705; G06F 11/267; G06F 11/2733
See application file for complete search history.

(56) References Cited

U.S. PATENT DOCUMENTS

| | | | |
|---|---|---|---|
| 6,754,862 B1 * | 6/2004 | Hoyer | G06F 17/5027 714/725 |
| 7,036,046 B2 | 4/2006 | Rally et al. | |
| 2004/0088604 A1 * | 5/2004 | Bland | G06F 11/221 714/43 |
| 2013/0124934 A1 * | 5/2013 | Jones | G01R 31/318547 714/727 |

OTHER PUBLICATIONS

U.S. Appl. No. 15/429,008, filed Feb. 9, 2017, Mahesh A. Iyer.

* cited by examiner

*Primary Examiner* — April Y Blair
*Assistant Examiner* — Dipakkumar B Gandhi
(74) *Attorney, Agent, or Firm* — Fletcher Yoder, P.C.

(57) ABSTRACT

An integrated circuit device includes a first partition and a second partition. The integrated circuit device also includes a Joint Test Action Group (JTAG) system that controls at least a portion of the integrated circuit device via logic signals. The JTAG system includes a JTAG interface that receives logic signals and a first JTAG hub instantiated in the first partition communicatively coupled to the JTAG interface. The integrated circuit device further includes a second JTAG hub instantiated in the second partition communicatively coupled to the first JTAG hub via a bridge.

20 Claims, 7 Drawing Sheets

SHARING A JTAG INTERFACE AMONG MULTIPLE PARTITIONS

BACKGROUND

The present disclosure relates generally to analyzing a hardware device in connection with a computer system. More particularly, the present disclosure relates to sharing an interface of an integrated circuit among multiple partitions of the integrated circuit.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

In the 1980s, integrated circuits were becoming commonplace. However, testing circuit boards that included the integrated circuits for faulty connections (e.g., due to imperfections in solder joints on the circuit boards, board connections, or bonds and bond wires from integrated circuit pads to pin lead frames) was difficult because the connections were unavailable to testing probes. The Joint Test Action Group (JTAG) standard (IEEE standard 1149.1) was developed to provide an interface on or between integrated circuits to discover these faults.

For a field programmable gate array (FPGA), a single standard JTAG interface is extended to a core fabric of the FPGA to build JTAG-based logic. Specifically, for an FPGA, a single JTAG hub is created in the core fabric to enable multiple instances of JTAG-based logic to share the single JTAG interface. However, an FPGA may be physically divided into multiple partitions, for example, to implement partial reconfiguration. While the single hub may be created in the core fabric of a partition (e.g., a root partition of the FPGA) to enable JTAG-based logic in the root partition to share the single JTAG interface, if JTAG-based logic were also created in other partitions of the FPGA, such JTAG-based logic would be unable to share the single JTAG interface.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

Present embodiments relate to sharing an interface of an integrated circuit among multiple partitions of the integrated circuit. The integrated circuit may be a field programmable gate array (FPGA), and the interface may be a Joint Test Action Group (JTAG) interface of the FPGA. A JTAG hub is created in each partition, wherein a first hub in a first partition is communicatively coupled to the JTAG interface, and a second hub in a second partition is communicatively coupled to the first hub via a JTAG bridge. In this manner, multiple partitions may share the JTAG interface through the hubs instantiated in each partition and associated bridges.

In a first embodiment, an integrated circuit device includes a first partition and a second partition. The integrated circuit device also includes a Joint Test Action Group (JTAG) system that controls at least a portion of the integrated circuit device via logic signals. The JTAG system includes a JTAG interface that receives logic signals and a first JTAG hub instantiated in the first partition communicatively coupled to the JTAG interface. The integrated circuit device further includes a second JTAG hub instantiated in the second partition communicatively coupled to the first JTAG hub via a bridge.

In a second embodiment, a Joint Test Action Group (JTAG) system includes a JTAG interface of an integrated circuit that receives JTAG logic signals. The JTAG system also includes a first JTAG hub instantiated in a first partition of the integrated circuit communicatively coupled to the JTAG interface. The JTAG system further includes a second JTAG hub instantiated in a second partition of the integrated circuit communicatively coupled to the first JTAG hub via a bridge.

In a third embodiment, a method includes creating a first partition in an integrated circuit. The method also includes creating a second partition in the integrated circuit. The method further includes instantiating a first Joint Test Action Group (JTAG) hub in the first partition communicatively coupled to a JTAG interface. The method also includes instantiating a second JTAG hub in the second partition. The method further includes instantiating a bridge to communicatively couple the first JTAG hub to the second JTAG hub.

Various refinements of the features noted above may be made in relation to various aspects of the present disclosure. Further features may also be incorporated in these various aspects as well. These refinements and additional features may be made individually or in any combination. For instance, various features discussed below in relation to one or more of the illustrated embodiments may be incorporated into any of the above-described aspects of the present invention alone or in any combination. The brief summary presented above is intended only to familiarize the reader with certain aspects and contexts of embodiments of the present disclosure without limitation to the claimed subject matter.

BRIEF DESCRIPTION OF THE DRAWINGS

Various aspects of this disclosure may be better understood upon reading the following detailed description and upon reference to the drawings in which.

DETAILED DESCRIPTION OF SPECIFIC EMBODIMENTS

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

A field programmable gate array (FPGA) may have a single standard Joint Test Action Group (JTAG) interface extended to a core fabric of the FPGA to build JTAG-based logic. A single JTAG hub is created in a partition of the core fabric to enable multiple instances of JTAG-based logic (e.g., system level debugging (SLD) endpoints) in the partition to share the single JTAG interface. Embodiments of the present disclosure relate to providing access to the JTAG interface from multiple instances of JTAG-based logic located in multiple partitions of the FPGA. A JTAG hub is created in each partition, wherein a first hub in a first partition is communicatively coupled to the JTAG interface, and a second hub in a second partition is communicatively coupled to the first hub via a JTAG bridge. In this manner, multiple partitions may share the JTAG interface through the hubs instantiated in each partition and associated bridges.

Additional information related to the JTAG interface, JTAG hubs, and the like, is included in U.S. Pat. No. 7,037,046, entitled "PLD debugging hub," which is incorporated herein by reference in its entirety for all purposes. While the present disclosure describes providing access to the JTAG interface with respect to an FPGA, it should be understood that the disclosed embodiments may apply to any integrated circuit that includes a JTAG interface.

Figure 1:
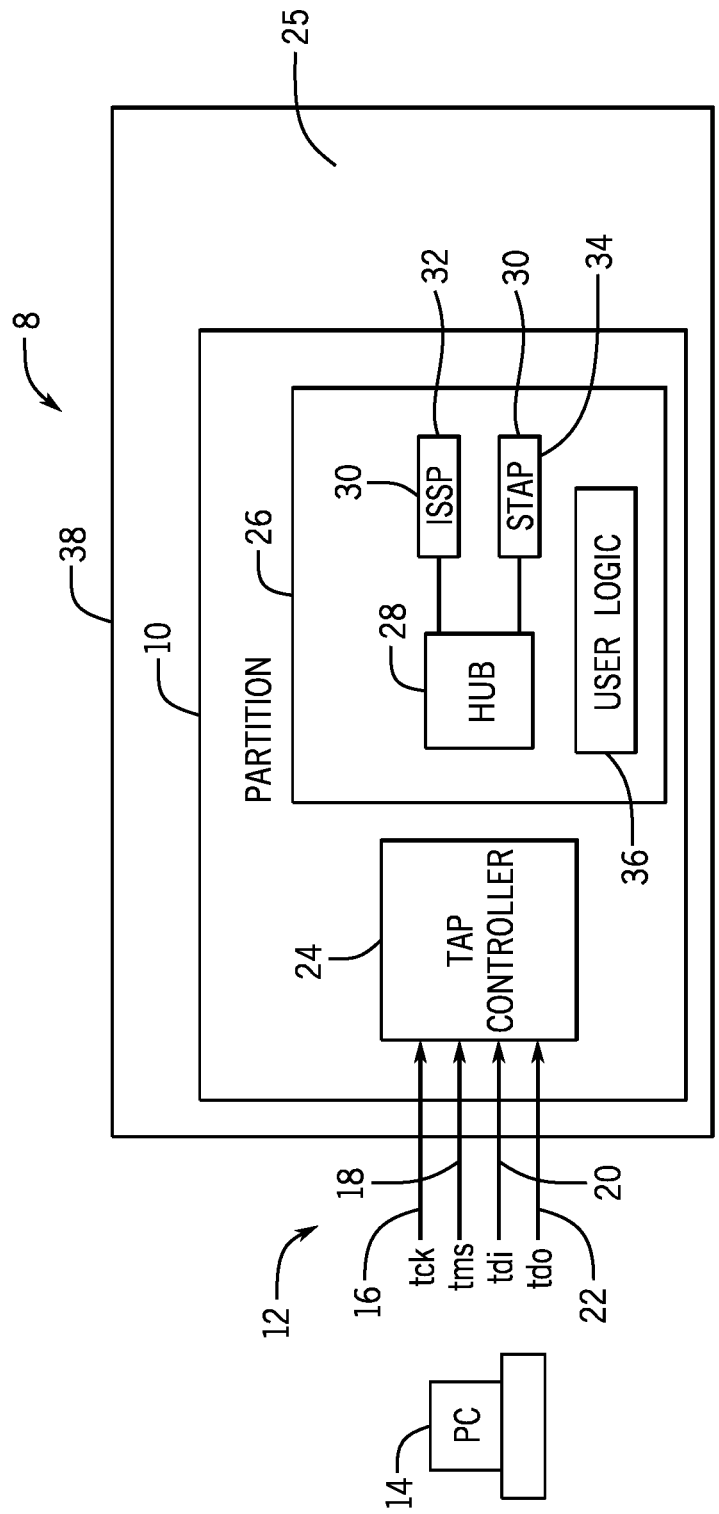
FIG. 1 is a block diagram of a Joint Test Action Group (JTAG) system that includes a field programmable gate array (FPGA) and a JTAG interface, in accordance with an embodiment of the present disclosure.

Keeping this in mind, FIG. 1 is a block diagram of a JTAG system 8 that includes an FPGA 10 and a JTAG interface 12, in accordance with an embodiment of the present disclosure. The JTAG interface 12 (e.g., JTAG-to-core interface) may enable a control system, such as a personal computer 14, to communicate with, control, and/or debug the FPGA 10. In some embodiments, the control system may be any suitable device that may control the FPGA 10 and/or the JTAG system 8, such as any device with a processor, microprocessor, or any combination thereof (e.g., a server, laptop, mobile device, and the like).

The JTAG interface 12 may include four logic signals: (1) TCK (Test Clock) signal 16 that is used to synchronize internal state machine operations of a JTAG Test Access Port (TAP) controller 24; (2) TMS (Test Mode Select) signal 18 that is sample at a rising edge of TCK to determine a next state; (3) TDI (Test Data In) signal 20 that represents data shifted into test or programming logic of the FPGA 10 and is sampled at the rising edge of TCK when the internal state machines is in a correct state; and (4) TDO (Test Data Out) signal 22 that represents data shifted out of the test or programming logic of the FPGA 10 and is valid on a falling edge of TCK when the internal state machines is in the correct state. The JTAG interface 12 may also include a fifth logic signal TRST (Test Reset) which, when available, can reset the state machine of a JTAG TAP controller 24. The FPGA 10 may include pins corresponding to each logic signal.

The TAP controller 24 includes the state machine whose transitions are controlled by the TMS signal 18. The state machine may control the behavior of the JTAG system 8. Typically, the TAP controller 24 may be implemented as hard logic (e.g., a dedicated hardware resource provided by the FPGA 10). However, in some embodiments, the TAP controller 24 may be implemented as soft logic (e.g., realized in a core fabric 25 of the FPGA 10). The core fabric 25 of the FPGA 10 may include logic units of the FPGA 10, such as logic modules (e.g., adaptive logic modules), look-up tables, adaptive look-up tables, flip-flops, arithmetic logic, digital signal processing (DSP) units, random access memories (RAMs), and the like.

The TAP controller 24 may communicatively couple to and control a JTAG hub 28 instantiated in a partition 26 of the FPGA 10. The partition 26 may be a physical division of resources of the FPGA 10. The hub 28 (or system level debugging (SLD) hub) may automatically arbitrate between multiple JTAG-based logic instances (e.g., system level debugging (SLD) endpoints 30) in the partition 26 that share the JTAG interface 12. That is, the hub 28 may control delivery of signals to and from the SLD endpoints 30. For example, the hub 28 may act as an arbiter that routes the TDI signal 20 between each SLD endpoint 30. In some embodiments, the hub 28 may include a state machine that mirrors the state machine of the TAP controller 24. Typically, the hub 28 and the SLD endpoints 30 may be implemented as soft logic. However, in some embodiments, the hub 28 and the SLD endpoints 30 may be implemented as hard logic.

The SLD endpoints 30 represent communication channels for end applications in the FPGA 10 that use the JTAG interface 12. Each end application, such as a SignalTap II Logic Analyzer, that uses a JTAG communication resource has its own communication channel (e.g., a SignalTap (STAP) interface 34) in the form of an SLD endpoint 30 to the hub 28. An end application may be any application or module programmed into the FPGA 10. The end application may analyze, control, or debug user logic 36. Each SLD endpoint 30 may have an instruction register and a set of data registers. The SLD endpoints 30 may include an In-System Sources and Probes (ISSP) interface 32, the SignalTap (STAP) interface 34, an In-System Memory Content Editor (ISMCE) interface, a JTAG bridge, and the like. The SLD endpoints 30 shown in FIG. 1 are merely illustrative, and it should be understood that any suitable SLD endpoint 30 (e.g., a JTAG Debug Bus Master interface, a JTAG Debug Packet Streamer interface, a Microprocessor Debugger Module interface, and the like) is contemplated in the present disclosure. The STAP interface 34 may communicatively couple to the user logic 36, which may be any electronic design created by a user that is programmed into the FPGA 10.

As illustrated, the FPGA 10 may be used in any suitable device 38 that may in turn use a configurable integrated circuit with the added benefit of flexibility from using the FPGA 10. For example, the device 38 may be a computer, computer interface, or any suitable computer component. The device 38 may also be telemetry, sensing, and/or control instrumentation. In some embodiments, the device 38 may be an automated robotic device. The device 38 may also be a cell phone or other communication device.

Figure 2:
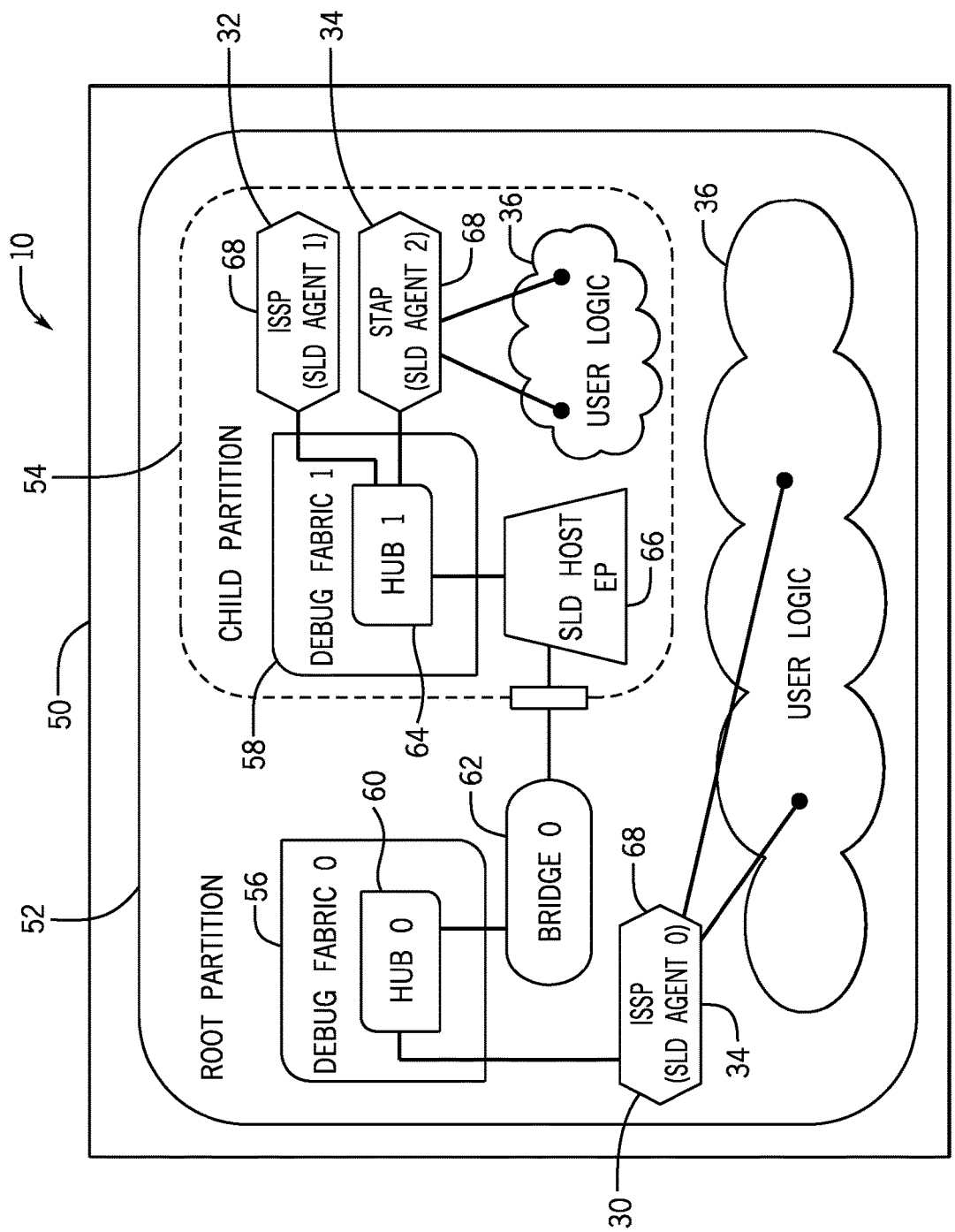
FIG. 2 is a block diagram illustrating a JTAG system that includes a parent partition and a child partition sharing a JTAG interface, in accordance with an embodiment of the present disclosure.

FIG. 2 is a block diagram illustrating a JTAG system 50 that includes a parent partition 52 and a child partition 54 sharing a JTAG interface 12, in accordance with an embodiment of the present disclosure. A partition is a block of the FPGA 10 that may be isolated from other parts of the FPGA 10, such that the partition may be reconfigured without reconfiguring the other parts of the FPGA 10. Multiple partitions may be used, for example, to implement partial reconfiguration of the FPGA 10. The parent partition 52 (e.g., a root partition) and the child partition 54 are arranged hierarchically, wherein the child partition 54 is nested or resides inside the root partition 52. Each partition 52, 54 includes debug fabric 56, 58—or logic units of the FPGA 10, such as logic modules (e.g., adaptive logic modules), look-up tables, adaptive look-up tables, flip-flops, arithmetic logic, digital signal processing (DSP) units, random access memories (RAMs), and the like, used and/or suitable for debugging purposes. The debug fabric 56 of the FPGA 10 may be a portion of the core fabric 25 that is suitable, assigned, and/or used for debugging purposes. The debug fabric 56 of the root partition 52 includes a hub 60 that may communicatively couple to the TAP controller 24 (see FIG. 1). As such, the hub 60 may receive and send signals from and to the TAP controller 24. The hub 60 may also route signals (e.g., the TDI signal 20) to child hubs (e.g., hub 64). As illustrated, the hub 60 may communicatively couple to an SLD endpoint 30, such as a STAP interface 34. The STAP interface 34 couples to the user logic 36 of the root partition 52.

For each partition of the FPGA 10 that has JTAG-based logic (e.g., an SLD endpoint 30), a JTAG hub logic instance is created in the partition. As illustrated, the child partition 54 has a JTAG hub 64 in the debug fabric 58. To enable JTAG functionality to the child hub 64, a JTAG source component (e.g., SLD host endpoint 66) is created. The SLD host endpoint 66 enables the hub 64 in the child partition 54 to connect to the hub 60 in the root partition 52 via a JTAG bridge 62. In some embodiments, the SLD host endpoint 66 may be part of a JTAG-to-core interface or any other core logic of the FPGA 10 that provides the JTAG interface 12.

The bridge 62 communicatively couples the root hub 60 to the SLD host endpoint 66 driving the child hub 64. The bridge 62 may be implemented as hard logic and map one or more JTAG logic signals (e.g., 12) between the root hub 60 and the child hub 64. In some embodiments, the hub 28 and the SLD endpoints 30 may be implemented as soft logic. The bridge 62 may share structural similarities to other JTAG based logic connected to a JTAG hub (e.g., 62), such as the SLD endpoint 30. As such, the hubs 60, 64 are coupled to each other in the same hierarchical way as the corresponding partitions 52, 54.

JTAG-based logic of the child partition 54, such as an SLD agent endpoint 68, may then use the JTAG interface 12. As illustrated, the SLD agent endpoints 68 include the ISSP interface 32 and the STAP interface 34, wherein the STAP interface 34 is communicatively coupled to the user logic 36 of the child partition 54.

Figure 3:
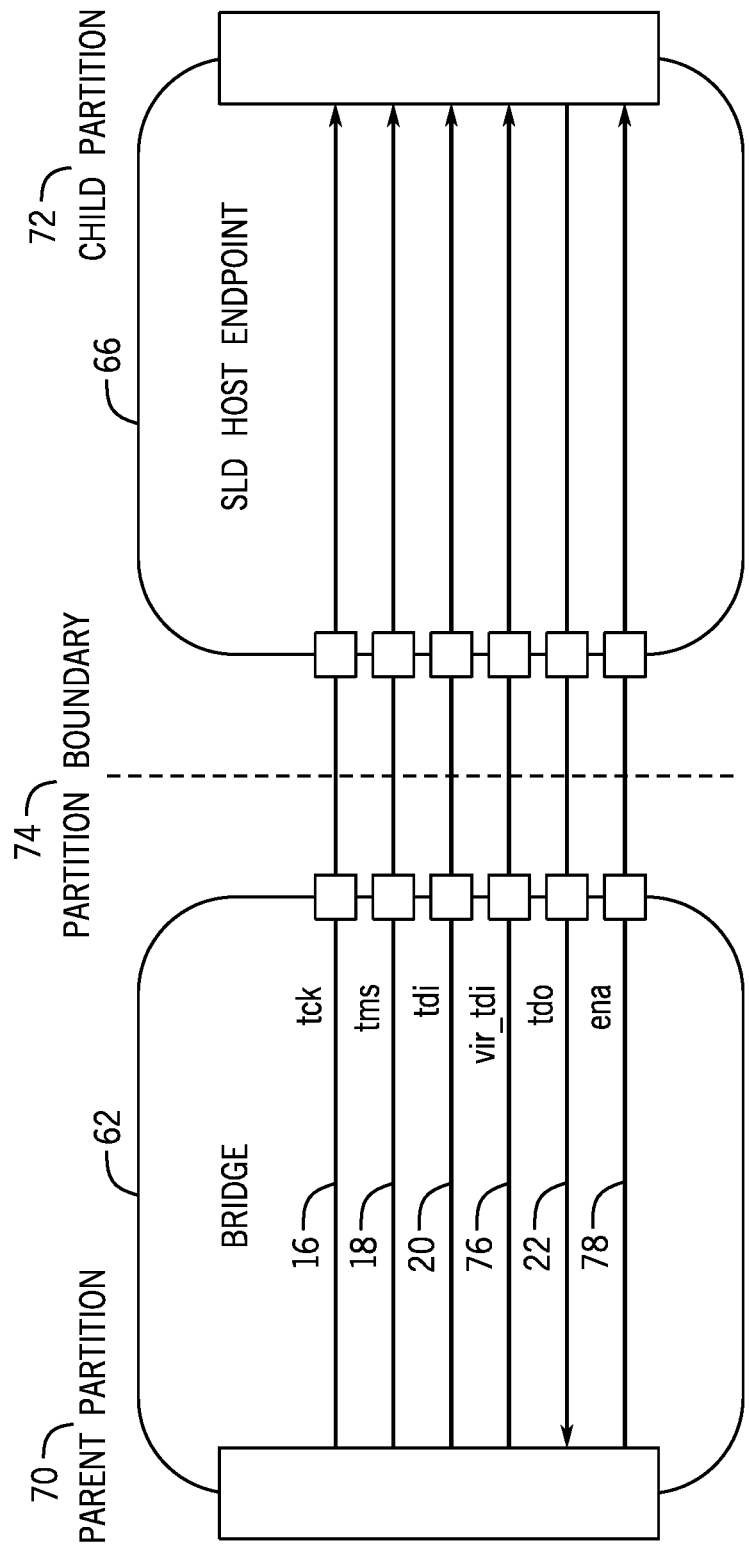
FIG. 3 is a diagram illustrating logic signals between a JTAG bridge in a parent partition and a system level debugging (SLD) host endpoint of a child partition, in accordance with an embodiment of the present disclosure.

FIG. 3 is a diagram illustrating logic signals between the JTAG bridge 62 in a parent partition 70 and an SLD host endpoint 66 of a child partition 72, in accordance with an embodiment of the present disclosure. A partition boundary 74 is shown to distinguish between the parent partition 70 and the child partition 72. The bridge 62 residing in the parent partition 70 sends the three logic signals, TCK 16, TMS 18, and TDI 20, to the SLD host endpoint 66 of the child partition 72 and receives the TDO logic signal from the SLD host endpoint 66. The bridge 62 also sends two logic signals in addition to the four standard JTAG logic signals, VIR_TDI 76 and ENA 78.

The ENA or enable signal 78 may enable downstream hubs to receive and send other JTAG logic signals 80 (e.g., TCK 16, TMS 18, TDI 20, VIR_TDI 76, and TDO 22) from and to the bridge 62. The ENA signal 78 may be provided from a parent JTAG hub 60 to a child JTAG hub 64 to enable the child hub 64, as the child hub 64 acts as an agent of the parent hub 60. When the ENA signal 78 received at a child hub 64 is low or has a zero value, the child hub 64 may not receive or ignore the incoming JTAG logic signals 80. When the ENA signal 78 high or has a value of 1, the child hub 64 may receive the incoming JTAG logic signals 80. Such an arrangement may avoid using a multiplexer to utilize the TCK logic signal 16, which may have a negative impact on system timing. In this manner, the bridge 62 connects the ENA signal 78 to a respective SLD agent endpoint 68. The VIR_TDI logic signal 76 may enable the parent hub 60 to transfer (e.g., serially) information to the child hub 64. In some embodiments, the VIR_TDI signal 76 may be 1 bit long.

Figure 4:
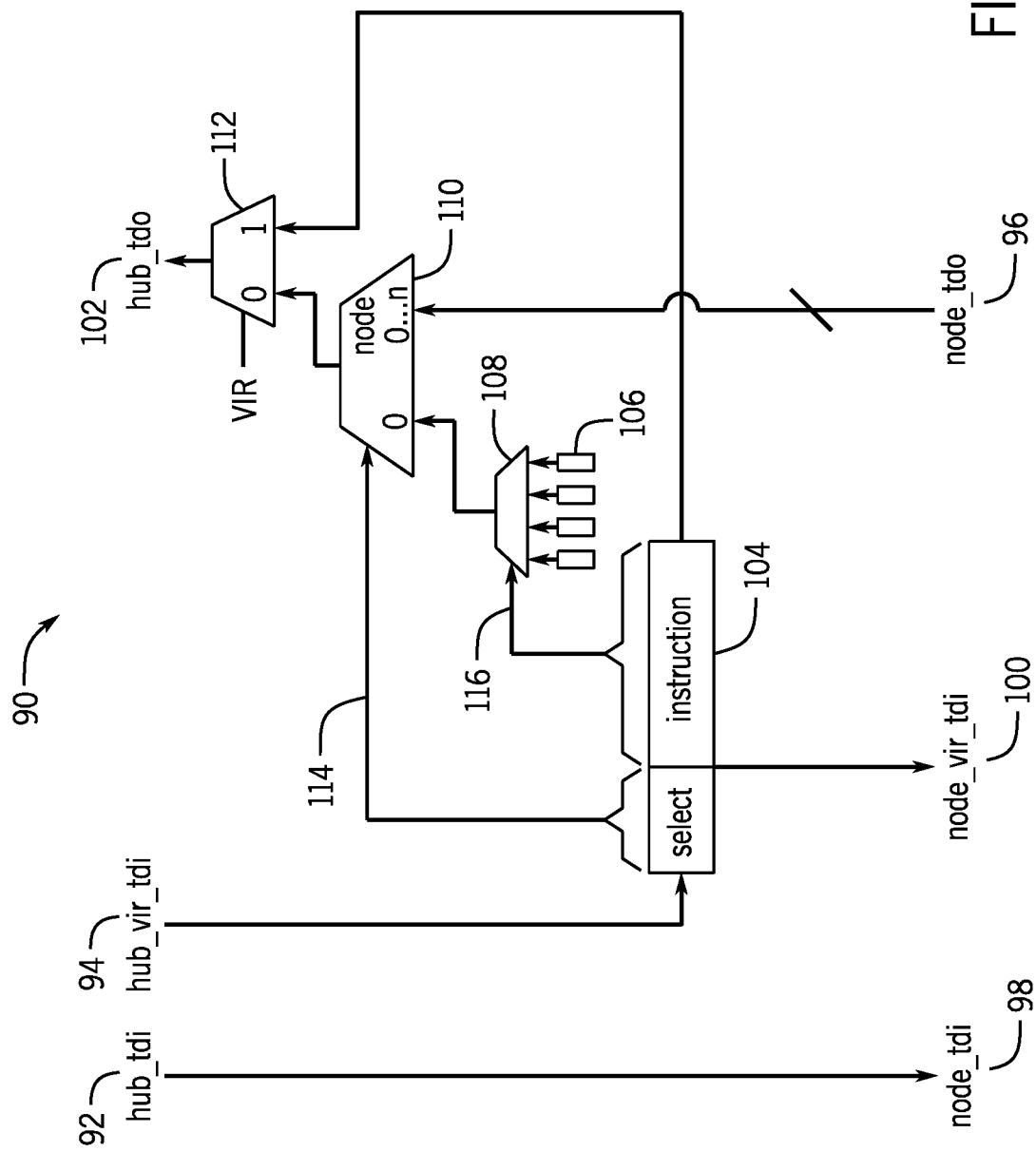
FIG. 4 is a diagram of circuit logic of a portion of a parent JTAG hub, in accordance with an embodiment of the present disclosure.

FIG. 4 is a diagram of circuit logic 90 of a portion of the parent JTAG hub 60, in accordance with an embodiment of the present disclosure. The circuit logic 90 includes input signals HUB_TDI 92, HUB_VIR_TDI 94, and NODE_TDO 96, and output signals NODE_TDI 98, NODE VIR_TDI 100, and HUB_TDO 102. As illustrated, the circuit logic 90 includes an instruction register or instruction shift register 104, data registers 106, a hub multiplexer 108, a node multiplexer 110, and a TDO multiplexer 112.

The HUB_TDI signal 92 may include data routed from the parent hub 60. For example, the HUB_TDI signal 92 may be provided on or based on the TDI logic signal 20 sent by the personal computer 14 to the TAP controller 24, and in turn sent to the parent hub 60. The HUB_TDI signal 92 may be routed to the child hub 64 as the NODE_TDI signal 98 via the bridge 62 and the SLD host endpoint 66 of FIG. 2.

The HUB_VIR_TDI signal 94 may include routing, instruction, and/or other information sent from the parent hub 60 directed to a child hub (e.g., the child hub 64). Information from the HUB_VIR_TDI signal 94 may be loaded into the instruction register 104. In some embodiments, the HUB_VIR_TDI signal 94 may provide an instruction that includes one or more select portions 114 that select downstream bridge nodes and downstream SLD agent endpoints 68, and an instruction payload 116. In this manner, the instruction register 104 of the parent hub 60 may accept input from the HUB_VIR_TDI signal 94. As such, instructions may be sent to child hubs in a single scan of the instruction register 104.

The data registers 106 may store information used by the parent hub 60. The hub multiplexer 108 may select information from the data registers 106. The node multiplexer 110 and TDO multiplexer 112 may receive information from the data registers 106 and/or the child hub 64 via the NODE_TDO signal 96 and transfer the information (e.g., serially) to the TAP controller 24.

With this in mind, protocol for governing the JTAG signal (e.g., the VIR_TDI signal 76) is defined such that the same JTAG signal behavior is produced at each SLD agent endpoint 68 regardless of which JTAG hub is connected. A first protocol provides a less (e.g., minimal) number of JTAG clock cycles to produce the same JTAG signal behavior at teach SLD agent endpoint 68. The first protocol breaks JTAG chain continuity in certain scans. A second protocol maintains JTAG chain continuity throughout. As such, scanning of the instruction register 104 differs between using the first protocol and the second protocol. However, scanning the data registers 106 may remain the same between using the first protocol and the second protocol. Moreover, scanning the data registers 106 may remain the same as scanning the data registers 106 of a single JTAG hub 28 in a single partition 26, such as of the FPGA 10 of FIG. 1.

To send information to downstream JTAG hubs or SLD agent endpoints, the control system (e.g., the personal computer 14) may send an instruction sequence of bits that include select or address bits configured to route the instruction sequence and an instruction payload of bits that includes the information to be sent. In the first protocol, the instruction sequence may have a length that is a sum of the select bits that route the instruction payload plus a width of the instruction register 104 of the destination JTAG hub that stores the instruction payload. In this manner, the instruction registers 104 of chained JTAG hubs (e.g., from a JTAG hub of a root partition to a destination JTAG hub communicatively coupled to a destination SLD endpoint agent) may be chained together. The select bits may correspond to a number of sets of select bits, each set identifying each bridge, and then each destination hub or SLD agent endpoint in a chain traveled by the instruction to reach its destination. The number of select bits may be any number suitable to identify each bridge and each destination hub or SLD agent endpoint in a JTAG system. The length of an instruction sequence may vary depending on the destination, and specifically the number of bridges and hubs to reach the destination. The select bits corresponding to a bridge, destination hub, or SLD agent endpoint may be stripped off the instruction sequence before the instruction sequence is sent to the respective bridge, destination hub, or SLD agent endpoint.

Using the JTAG system 50 of FIG. 2 as an example, an instruction sequence to send a 10 bit instruction payload (e.g., 0000000001) to SLD agent endpoint 1 (68) includes identifying, from the hub 0 (60), bridge 0 (62) by using a first select bit sequence (e.g., 001), the SLD agent endpoint 1 (68) using a second select bit sequence (e.g., 001), and the instruction payload. As such, the instruction sequence to send the instruction payload 0000000001 to SLD agent endpoint 1 (68) may be 0010010000000001. While the following examples use three-bit sequences for each set of select bits to identify bridges and destination hubs or SLD agent endpoints, it should be understood that more or fewer select bits may be used in each set, such that the number of select bits in each set is suitable to determine the bridges and destination hubs or SLD agent endpoints.

Using the JTAG system 50 of FIG. 2 as another example, an instruction sequence to send a 10 bit instruction payload (e.g., 0000000001) to hub 1 (64) includes identifying, from the hub 0 (60), bridge 0 (62) by using a first select bit sequence (e.g., 001), the hub 1 (64) using a second select bit sequence (e.g., 000), and the instruction payload. In this example, a hub may be identified by a set of selection bits that are zeroed (e.g., 000). In other embodiments, any suitable unique sequence of bits may be used to identify the hub (e.g., 111, 001, and the like). As such, the instruction sequence to send the instruction payload 0000000001 to hub 1 (142) may be 0010000000000001.

This first protocol may break JTAG chain continuity because a number of data registers 106 in the chain may not match a number of instruction register shifts for a next instruction register 104. Thus, to maintain continuity, the number of instruction register shifts matches the number of data registers 106 in the chain. As such, a second protocol that maintains JTAG chain continuity may issue a separate instruction corresponding to each level of a JTAG bridge 62, starting from the root partition 52 level down to the destination level (e.g., the hub 64 or the SLD agent endpoint 68 of a child partition 54).

To switch from one JTAG hub to another in the hierarchy (e.g., from the hub 60 in root partition 52 to hub 64 in child partition 54 in FIG. 2), the same instruction sequence that enables a bridge 62 is carried out from the destination level (e.g., the hub 64 or the SLD agent endpoint 68 of a child partition 54) up, one level at a time, to a common ancestor JTAG hub (e.g., in a parent partition 52). Then, each JTAG hub is enabled, one level at a time, down to the destination level (e.g., the hub 64 or the SLD agent endpoint 68 of a child partition 54).

The JTAG system 50 of FIG. 2 may be used to illustrate the second protocol that maintains JTAG chain continuity. For example, to send an instruction sequence to the SLD agent endpoint 1 (68), the bridge 0 (62) may first be enabled by sending an enable instruction sequence that includes identifying the bridge 0 by using the first select bit sequence (e.g., 001) followed by a 10 bit sequence (e.g., an enable sequence, a junk sequence, or any suitable sequence). As such, the enable instruction sequence to enable the bridge 0 may be the 13 bit sequence: 0010000000000. Based on sending the enable instruction sequence, a shift chain length to the SLD agent endpoint 1 (68) is realized to be 16 bits total. The instruction sequence may include identifying, from the hub 0 (60), the bridge 0 (62) by using the first select bit sequence (e.g., 001), the SLD agent endpoint 1 (68) using the second select bit sequence (e.g., 001), and an instruction payload of 10 bit length (e.g., 0000000001). As such, the instruction sequence to the SLD agent endpoint 1 (68) may be the 16 bit sequence: 0010010000000001.

To send an instruction sequence to the SLD agent endpoint 0 (68), the hub 0 (60) may first be enabled by sending an enable instruction sequence that is the current shift chain length (e.g., 16 bits) as realized above. The enable instruction sequence may include identifying the hub 0 by using the first select bit sequence (e.g., 000), followed by a 13 bit sequence (e.g., an enable sequence, a junk sequence, or any suitable sequence). As such, the enable instruction sequence to enable the hub 0 may be the 16 bit sequence: 0000000000000000. Based on sending the enable instruction sequence, a shift chain length to the SLD agent endpoint 0 (68) is realized to be 13 bits total. As such, the instruction sequence includes identifying, from the hub 0 (60), the SLD agent endpoint 0 (68) using a first select bit sequence (e.g., 010) and an instruction payload of 10 bit length (e.g., 0000000001). As such, the instruction sequence to send the instruction payload to SLD agent endpoint 0 (68) may be the 13 bit sequence: 0100000000001.

Figure 5:
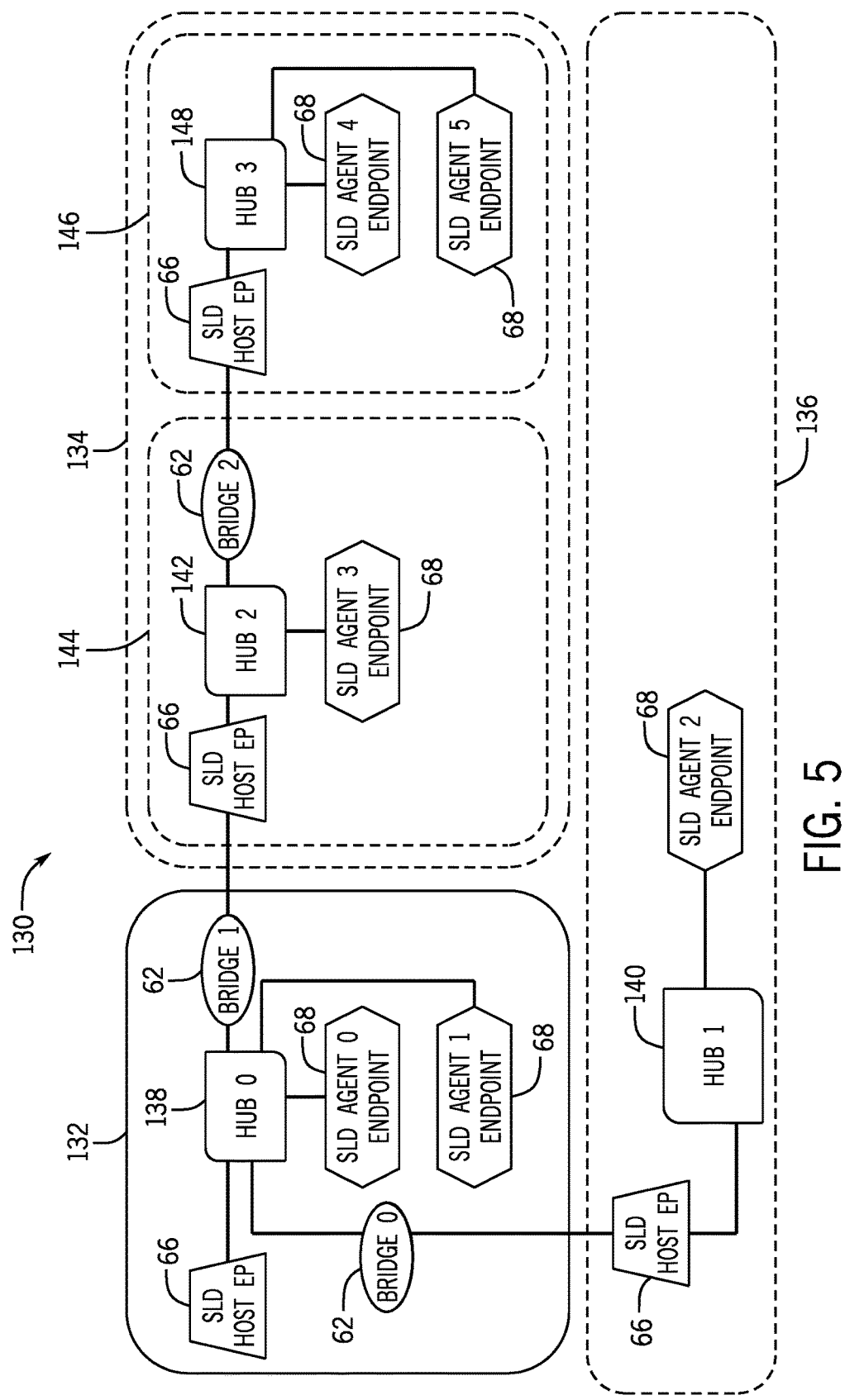
FIG. 5 is an example of a JTAG system that includes sibling partitions sharing a JTAG interface, in accordance with an embodiment of the present disclosure.

FIG. 5 is an example of a JTAG system 130 that includes sibling partitions 132, 134, 136 sharing the JTAG interface 12, in accordance with an embodiment of the present disclosure. As illustrated, JTAG hubs 140, 142 in two sibling partitions 134, 136 inherit the JTAG interface 12 from a JTAG hub 138 of a third sibling partition 132. The partition 134 is further partitioned into two sibling sub-partitions 144, 146. An additional JTAG hub 148 of the sub-partition 146 inherits the JTAG interface 12 from the JTAG hub 142 of its sibling sub-partition 144. The SLD host endpoint 66 of the partition 132 that distributes the JTAG interface 12 may communicatively couple to a JTAG hub 60 of a parent (e.g., root) partition (e.g., 52) via a JTAG bridge 62, as illustrated in the JTAG system 50 of FIG. 2. In this manner, the JTAG interface 12 may be shared between sibling partitions (e.g., 132, 134, 136) rather than solely acquiring the interface 12 from another partition, as shown in the JTAG system 50 of FIG. 2. Sharing the JTAG interface 12 between sibling partitions may use less logic when compared to an inherited JTAG interface 12 where the parent partition is not debugged.

Using the JTAG system 130 of FIG. 5 as an example, an instruction sequence to send a 10 bit instruction payload (e.g., 0000000001) to SLD agent endpoint 2 (68) includes identifying, from the hub 0 (138), bridge 0 (62) by using a first select bit sequence (e.g., 011), the SLD agent endpoint 2 (68) using a second select bit sequence (e.g., 010), and the instruction payload. As such, the instruction sequence to send the instruction payload 0000000001 to SLD agent endpoint 2 (68) may be 0110100000000001. As mentioned above, while the following examples use three-bit sequences for each set of select bits to identify bridges and destination hubs or SLD agent endpoints, it should be understood that more or fewer select bits may be used in each set, such that the number of select bits in each set is suitable to determine the bridges and destination hubs or SLD agent endpoints.

Using the JTAG system 130 of FIG. 5 as another example, an instruction sequence to send a 10 bit instruction payload (e.g., 0000000001) to hub 2 (142) includes identifying, from the hub 0 (138), bridge 1 (62) by using a first select bit sequence (e.g., 001), the hub 2 (142) using a second select bit sequence (e.g., 000), and the instruction payload. In this example, as with the preceding examples, a hub may be identified by a set of selection bits that are zeroed (e.g., 000). In other embodiments, any suitable unique sequence of bits may be used to identify the hub (e.g., 111, 001, and the like). As such, the instruction sequence to send the instruction payload 0000000001 to hub 2 (142) may be 0010000000000001.

Using the JTAG system 130 of FIG. 5 as yet another example, an instruction sequence to send a 10 bit instruction payload (e.g., 0000000001) to SLD agent endpoint 5 (68) includes identifying, from the hub 0 (138), bridge 1 (62) by using a first select bit sequence (e.g., 001), bridge 2 using a second select bit sequence (e.g., 010), the SLD agent endpoint 5 (68) using a third select bit sequence (e.g., 101), and the instruction payload. As such, the instruction sequence to send the instruction payload 0000000001 to SLD agent endpoint 5 (68) may be 0010101010000000001. As shown in this example, reaching the SLD agent endpoint 5 (68) adds three bits to the instructions in the previous examples due to the second select bit sequence corresponding to the additional bridge (i.e., bridge 2 (62)) in the chain.

Figure 6:
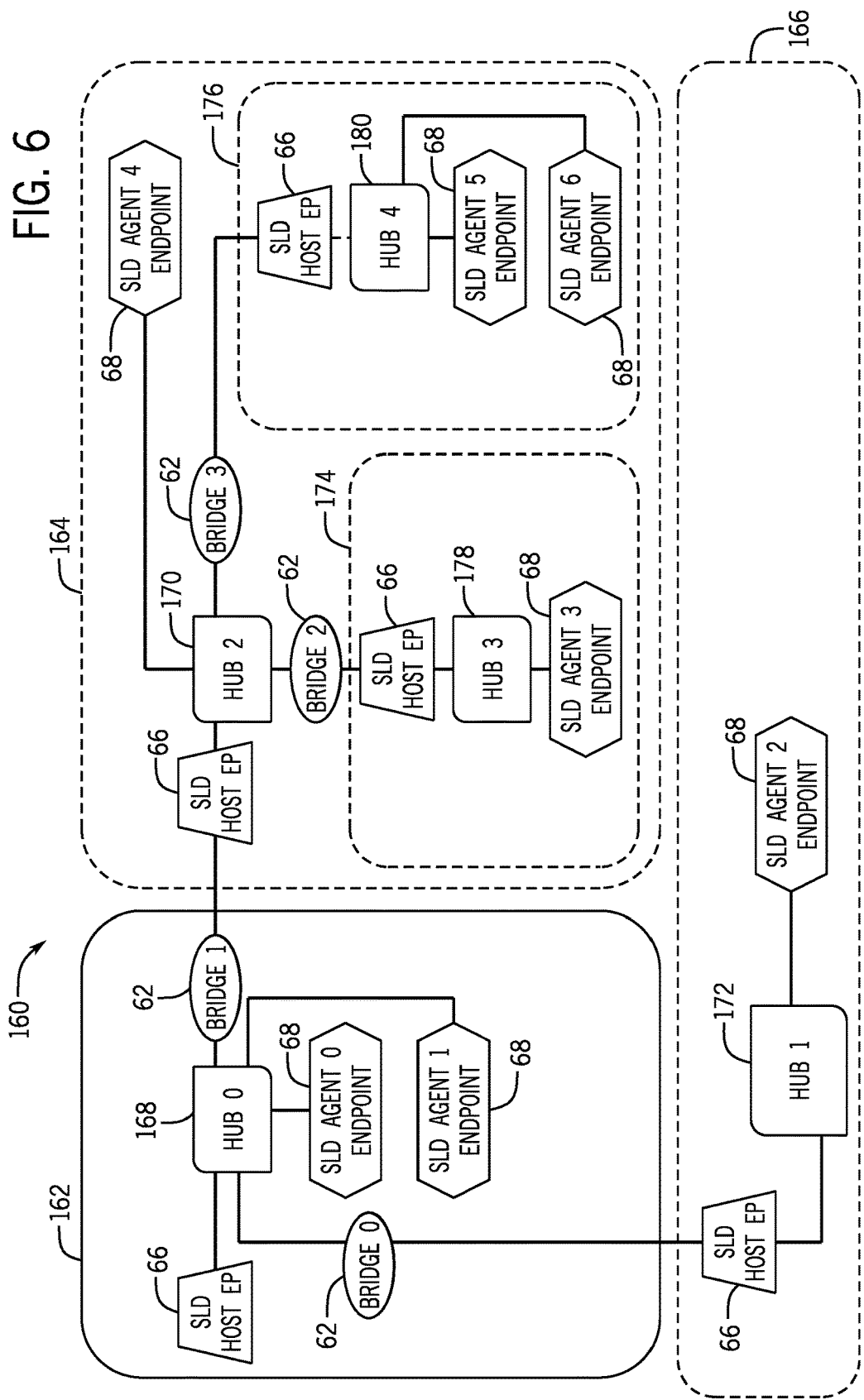
FIG. 6 is an example of a JTAG system that includes sibling partitions sharing a JTAG interface, in accordance with an embodiment of the present disclosure.

FIG. 6 is an example of a JTAG system 160 that includes sibling partitions 162, 164, 166 sharing the JTAG interface 12, in accordance with an embodiment of the present disclosure. As illustrated, JTAG hubs 170, 172 in two sibling partitions 164, 166 inherit the JTAG interface 12 from a JTAG hub 168 of a third sibling partition 162. The partition 164 is further partitioned into two sibling sub-partitions 174, 176. JTAG hubs 178, 180 of the sibling sub-partitions 174, 176 inherit the JTAG interface 12 from the hub 170 of the parent partition 164. The SLD host endpoint 66 of the partition 162 that distributes the JTAG interface 12 may communicatively couple to a JTAG hub 60 of a parent (e.g., root) partition (e.g., 52) via a JTAG bridge 62, as illustrated in the JTAG system 50 of FIG. 2. The JTAG system 160 illustrates a canonical case where sharing the JTAG interface 12 between JTAG hubs 168, 170, 172, 178, 180 forms a tree relationship. In particular, each partition (e.g., 164) of the FPGA 10 has a JTAG hub—apart from JTAG hubs (e.g., 178, 180) in subpartitions (e.g., 174, 176) of the partition.

Using the JTAG system 160 of FIG. 6 as an example, an instruction sequence to send a 10 bit instruction payload (e.g., 0000000001) to SLD agent endpoint 2 (68) includes identifying, from the hub 0 (168), bridge 0 (62) by using a first select bit sequence (e.g., 011), the SLD agent endpoint 2 (68) using a second select bit sequence (e.g., 010), and the instruction payload. As such, the instruction sequence to send the instruction payload 0000000001 to SLD agent endpoint 2 (68) may be 0110100000000001. As mentioned above, while the following examples use three-bit sequences for each set of select bits to identify bridges and destination hubs or SLD agent endpoints, it should be understood that more or fewer select bits may be used in each set, such that the number of select bits in each set is suitable to determine the bridges and destination hubs or SLD agent endpoints.

Using the JTAG system 160 of FIG. 6 as another example, an instruction sequence to send a 10 bit instruction payload (e.g., 0000000001) to SLD agent endpoint 4 (68) includes identifying, from the hub 0 (168), bridge 1 (62) by using a first select bit sequence (e.g., 001), the SLD agent endpoint 4 (68) using a second select bit sequence (e.g., 100), and the instruction payload. As such, the instruction sequence to send the instruction payload 0000000001 to SLD agent endpoint 4 (68) may be 0011000000000001.

Using the JTAG system 160 of FIG. 6 as another example, an instruction sequence to send a 10 bit instruction payload (e.g., 0000000001) to hub 3 (178) includes identifying, from the hub 0 (168), bridge 1 (62) by using a first select bit sequence (e.g., 001), bridge 2 (62) using a second select bit sequence (e.g., 010), hub 3 (178) using a third select bit sequence (e.g., 000), and the instruction payload. In this example, as with the preceding examples, a hub may be identified by a set of selection bits that are zeroed (e.g., 000). In other embodiments, any suitable unique sequence of bits may be used to identify the hub (e.g., 111, 001, and the like). As such, the instruction sequence to send the instruction payload 0000000001 to hub 3(178) may be 0010100000000000001.

Using the JTAG system 160 of FIG. 6 as yet another example, an instruction sequence to send a 10 bit instruction payload (e.g., 0000000001) to SLD agent endpoint 6 (68) includes identifying, from the hub 0 (168), bridge 1 (62) by using a first select bit sequence (e.g., 001), bridge 3 using a second select bit sequence (e.g., 011), the SLD agent endpoint 6 (68) using a third select bit sequence (e.g., 110), and the instruction payload. As such, the instruction sequence to send the instruction payload 0000000001 to SLD agent endpoint 6 (68) may be 0010111100000000001.

Figure 7:
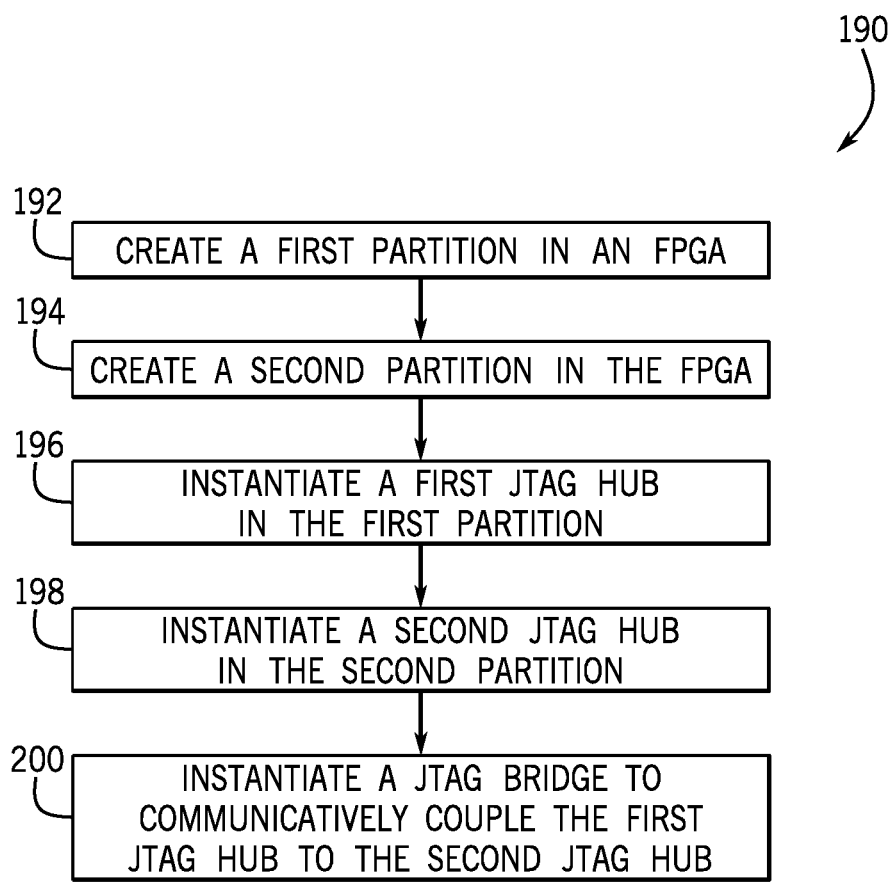
FIG. 7 is a flowchart of a method for sharing a JTAG interface among multiple partitions, in accordance with an embodiment of the present disclosure.

FIG. 7 is a flowchart of a method 190 for sharing a JTAG interface 12 among multiple partitions, in accordance with an embodiment of the present disclosure. The method 190 may be performed by any suitable device that may control the FPGA 10, such as a control system (e.g., the personal computer 14). While the method 190 is described using steps in a specific sequence, it should be understood that the present disclosure contemplates that the describe steps may be performed in different sequences than the sequence illustrated, and certain described steps may be skipped or not performed altogether. In some embodiments, the method 190 may be implemented by executing instructions stored in a tangible, non-transitory, computer-readable medium, such as one or more memory devices of the personal computer 14, and using one or more processors of the personal computer 14.

The control system creates (block 192) a first partition (e.g., a root partition 52) in the FPGA 10. The control system also creates (block 194) a second partition (e.g., a child partition 54) in the FPGA 10. In some embodiments, the second partition may be a child or nested partition of the first partition. In alternative embodiments, the second partition may not be a child partition of the first partition, and instead be a sibling partition of the first partition.

The control system instantiates (block 196) a first JTAG hub (e.g., 60) in the first partition. The control system also instantiates (block 198) a second JTAG hub (e.g., 64) in the second partition. The control system instantiates (block 200) a JTAG bridge (e.g., 62) to communicatively couple the first JTAG hub to the second JTAG hub. The control system may instantiate the first JTAG hub in the first partition. Additionally, the control system may instantiate an SLD host endpoint (e.g, 66) in the second partition to communicatively couple the second JTAG hub and the JTAG bridge. In this manner, the first and second JTAG hubs are created in each partition of the FPGA 10, wherein the hubs mimic the relationship of the partitions. Using the first or second JTAG protocols discussed above, the method 190 enables sharing the JTAG interface 12 among multiple partitions.

In some embodiments, an FPGA may be physically divided into multiple partitions to implement partial reconfiguration. Using the JTAG system 130 of FIG. 5 as an example, the FPGA including the JTAG system 130 may be partially reconfigured by changing the configuration of the partition 136. That is, one or more hubs may be added or removed from the partition 136, one or more SLD agent endpoints 68 may be added or removed from the partition 136, and/or the partition 136 may be further partitioned into subpartitions, each of which may have one or more hubs and/or one or more SLD agent endpoints 68. As such, the JTAG system 130 may enable an information instruction to be sent from a control system (e.g., the personal computer 14) to the partition 136 that interrogates the partition 136 (via a hub of the partition 136) and in turn receives information related to a current configuration of the partition 136. The information returned by the partition 136 may include a configuration and/or number of hubs and/or SLD agent endpoints 68 in the partition 136. In this manner, the disclosed JTAG system may efficiently support partial configuration in an FPGA by enabling discovery of configurations of recently configured partitions without querying configurations of each partition of the entire FPGA, which may be time-consuming, tedious, and inefficient.

While the embodiments set forth in the present disclosure may be susceptible to various modifications and alternative forms, specific embodiments have been shown by way of example in the drawings and have been described in detail herein. However, it should be understood that the disclosure is not intended to be limited to the particular forms disclosed. The disclosure is to cover all modifications, equivalents, and alternatives falling within the spirit and scope of the disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. An integrated circuit device comprising:
   a first partition and a second partition, wherein the first partition is reconfigurable without reconfiguring the second partition, wherein the second partition is reconfigurable without reconfiguring the first partition; and
   a boundary scan system configured to control at least a portion of the integrated circuit device via a plurality of logic signals, wherein the boundary scan system comprises:
   a boundary scan interface configured to receive the plurality of logic signals;
   a first boundary scan hub configured in the first partition and being communicatively coupled to the boundary scan interface; and
   a second boundary scan hub configured in the second partition and being communicatively coupled to the first boundary scan hub via a bridge.

2. The integrated circuit device of claim 1, wherein the second partition comprises a system level debugging (SLD) host endpoint, wherein the second boundary scan hub is communicatively coupled to the SLD host endpoint and the SLD host endpoint is communicatively coupled to the bridge.

3. The integrated circuit device of claim 1, wherein the second partition is nested in the first partition.

4. The integrated circuit device of claim 1, wherein the first partition and the second partition are sibling partitions.

5. The integrated circuit device of claim 1, wherein the boundary scan system is configured to send a set of information payload bits to the second boundary scan hub using an instruction sequence of bits, wherein the instruction sequence comprises:
   a first set of select bits that identify the bridge;
   a second set of select bits that identify the second boundary scan hub; and
   the set of information payload bits.

6. The integrated circuit device of claim 1, comprising a first system level debugging (SLD) agent endpoint coupled to the first boundary scan hub in the first partition, and a second SLD agent endpoint coupled to the second boundary scan hub in the second partition.

7. The integrated circuit device of claim 6, wherein the boundary scan system is configured to send a set of information payload bits to the second SLD agent endpoint using an instruction sequence of bits, wherein the instruction sequence comprises:
   a first set of select bits that identify the bridge;
   a second set of select bits that identify the second SLD agent endpoint; and
   the set of information payload bits.

8. The integrated circuit device of claim 6, wherein the first SLD agent endpoint and the second SLD agent endpoint each comprises an In-System Sources and Probes (ISSP) interface, a SignalTap (STAP) interface, an In-System Memory Content Editor (ISMCE) interface, a boundary scan Debug Bus Master interface, a boundary scan Debug Packet Streamer interface, or a Microprocessor Debugger Module interface.

9. The integrated circuit device of claim 1, wherein the integrated circuit device comprises a field programmable gate array (FPGA).

10. A boundary scan system comprising:
a boundary scan interface of an integrated circuit configured to receive a plurality of boundary scan logic signals;
a first boundary scan hub configured in a first partition of the integrated circuit and communicatively coupled to the boundary scan interface; and
a second boundary scan hub configured in a second partition of the integrated circuit and communicatively coupled to the first boundary scan hub via a bridge, wherein the first partition is reconfigurable without reconfiguring the second partition, wherein the second partition is reconfigurable without reconfiguring the first partition.

11. The boundary scan system claim 10, comprising a third boundary scan hub configured in a third partition of the integrated circuit and communicatively coupled to the second boundary scan hub via a second bridge.

12. The boundary scan system claim 11, wherein the third partition is nested in the second partition and the second bridge is configured in the second partition.

13. The boundary scan system claim 11, wherein the second partition and the third partition are sibling partitions and the second bridge is configured in the second partition.

14. A method comprising:
creating a first partition in an integrated circuit;
creating a second partition in the integrated circuit, wherein the first partition is reconfigurable without reconfiguring the second partition, wherein the second partition is reconfigurable without reconfiguring the first partition;
configuring a first boundary scan hub in the first partition, the first boundary scan hub being communicatively coupled to a boundary scan interface;
configuring a second boundary scan hub in the second partition; and
configuring a bridge to communicatively couple the first boundary scan hub to the second boundary scan hub.

15. The method of claim 14, wherein the bridge is configured in the first partition.

16. The method of claim 14, comprising configuring a system level debugging (SLD) host endpoint in the second partition, the SLD host endpoint communicatively coupling the second boundary scan hub to the bridge.

17. The method of claim 14, comprising sending a set of information payload bits to the second boundary scan hub using an instruction sequence of bits, wherein the instruction sequence comprises:
a first set of select bits that identify the bridge;
a second set of select bits that identify the second boundary scan hub; and
the set of information payload bits.

18. The method of claim 17, wherein the first boundary scan hub comprises a first set of data registers and a first instruction register that shifts in the instruction sequence, the second boundary scan hub comprises a second set of data registers and a second instruction register that shifts in at least a portion of the instruction sequence, and a total number of shifts to shift the instruction sequence into the first instruction register and shift the instruction sequence into the second instruction register matches a total number of data registers in the first set of data registers and the second set of data registers.

19. The method of claim 14, wherein comprising configuring an SLD agent endpoint in the second partition communicatively coupled to the second boundary scan hub.

20. The method of claim 19, comprising sending a set of information payload bits to the SLD agent endpoint using an instruction sequence of bits, wherein the instruction sequence comprises:
a first set of select bits that identify the bridge;
a second set of select bits that identify the SLD agent endpoint; and
the set of information payload bits.

* * * * *